(12) United States Patent
Dakshina-Murthy et al.

(10) Patent No.: US 7,084,071 B1
(45) Date of Patent: *Aug. 1, 2006

(54) USE OF MULTILAYER AMORPHOUS CARBON ARC STACK TO ELIMINATE LINE WARPAGE PHENOMENON

(75) Inventors: Srikanteswara Dakshina-Murthy, Austin, TX (US); Scott A. Bell, San Jose, CA (US); Richard J. Huang, Cupertino, CA (US); Richard C. Nguyen, Fremont, CA (US); Cyrus E. Tabery, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 195 days.

This patent is subject to a terminal disclaimer.

(21) Appl. No.: 10/244,650

(22) Filed: Sep. 16, 2002

(51) Int. Cl.
*H01L 21/461* (2006.01)
*H01L 21/302* (2006.01)

(52) U.S. Cl. .................. 438/717; 438/719; 438/725

(58) Field of Classification Search ................ 438/717, 438/719, 725
See application file for complete search history.

(56) References Cited

U.S. PATENT DOCUMENTS

| | | | |
|---|---|---|---|
| 4,382,100 A | | 5/1983 | Holland |
| 5,185,293 A | | 2/1993 | Franke et al. |
| 5,357,119 A | * | 10/1994 | Wang et al. .................. 257/18 |
| 5,385,762 A | | 1/1995 | Prins |
| 5,656,128 A | * | 8/1997 | Hashimoto et al. ........... 216/47 |
| 5,679,608 A | | 10/1997 | Cheung et al. |
| 5,721,090 A | | 2/1998 | Okamoto et al. |
| 5,759,746 A | * | 6/1998 | Azuma et al. .............. 430/313 |
| 5,776,602 A | | 7/1998 | Ueda et al. |
| 5,837,357 A | | 11/1998 | Matsuo et al. |
| 5,891,575 A | | 4/1999 | Marchywka et al. |
| 5,981,398 A | * | 11/1999 | Tsai et al. .................... 438/710 |
| 6,030,541 A | | 2/2000 | Adkisson et al. |
| 6,121,158 A | | 9/2000 | Benchikha et al. |
| 6,140,200 A | | 10/2000 | Eldridge |
| 6,171,343 B1 | | 1/2001 | Dearnaley et al. |
| 6,350,390 B1 | | 2/2002 | Liu et al. |
| 6,365,320 B1 | | 4/2002 | Foote et al. |
| 6,368,924 B1 | | 4/2002 | Mancini et al. |
| 6,388,924 B1 | | 5/2002 | Nasu |
| 6,413,852 B1 | | 7/2002 | Grill et al. |
| 6,428,894 B1 | | 8/2002 | Babich et al. |
| 6,573,030 B1 | | 6/2003 | Fairbairn et al. |
| 6,596,553 B1 | | 7/2003 | Lin et al. |
| 6,673,684 B1 | | 1/2004 | Huang et al. |
| 6,750,127 B1 | * | 6/2004 | Chang et al. ............... 438/585 |

(Continued)

OTHER PUBLICATIONS

Yamaguchi, A. et al., "Ar Ion implantation into Resist For Etching Resistance Improvement", Proceedings of SPIE vol. 4345 (2001), pp. 655-664.

(Continued)

*Primary Examiner*—Duy-Vu N. Deo
(74) *Attorney, Agent, or Firm*—Foley & Lardner LLP

(57) ABSTRACT

A method of producing an integrated circuit includes providing a layer of polysilicon material above a semiconductor substrate and providing an amorphous carbon layer over the polysilicon material layer. The amorphous carbon layer comprises at least one undoped amorphous carbon layer and at least one doped amorphous carbon layer. A portion of the amorphous carbon layer is removed to form a hard mask, and the polysilicon material layer is etched according to the hard mask to form a line of polysilicon material.

23 Claims, 6 Drawing Sheets

U.S. PATENT DOCUMENTS 6,764,949 B1 * 7/2004 Bonser et al. .............. 438/666

OTHER PUBLICATIONS

Borzenko, V. et al., "The Effect of Ion Implantation On Polymer Mask Resistance To Ion Beam Etching", Vacuum, 38, 1007 (1988), pp. 1007-1009.

R. Gago, et al., "Bonding and hardness in nonhydrogenated carbon films with moderate $sp^3$ content", Journal of Applied Physics, vol. 87, No. 11, Jun. 1, 2000, 7 pgs.

Wolf, S., Tauber, R. N., "Silicon Processing For the VLSI Era", Lattice Press, Sunset Beach, CA; 1986; pp. 322, 384-385, 556-557.

U.S. Appl. No. 10/215,173, entitled "Use of Amorphous Carbon Hard Mask for Gate Patterning to Eliminate Requirement of Poly Re-Oxidation", as filed on Aug. 8, 2002, including claims, drawings, and abstract (29 pages).

U.S. Appl. No. 10/277,760, entitled "Sacrificial Air Gap Layer for Insulation of Metals", as filed on Aug. 8, 2002, including claims, drawings, and abstract (17 pages).

U.S. Appl. No. 10/217,730, entitled "Ion Implantation to Modulate Amorphous Carbon Stress", as filed on Aug. 13, 2002, including claims, drawings, and abstract (29 pages).

U.S. Appl. No. 10/424,420, entitled "Use of Amorphous Carbon for Gate Patterning", as filed on Apr. 28, 2003, by including claims, drawings, and abstract (30 pages).

U.S. Appl. No. 10/230,794, entitled "Formation of Amorphous Carbon Arc Stack Having Graded Transition Between Amorphous Carbon and Arc Material", as filed on Aug. 29, 2002, including claims, drawings, and abstract (29 pages).

U.S. Appl. No. 10/230,775, entitled "Use of Buffer Dielectric Layer with Amorphous Carbon Mask to Reduce Line Warpage", as filed on Aug. 29, 2002, including claims, drawings, and abstract (28 pages).

U.S. Appl. No. 10/335,726, entitled "Use of Diamond as a Hard Mask Material", as filed on Jan. 2, 2003, including claims, drawings, and abstract (26 pages).

U.S. Appl. No. 10/424,675, entitled "Selective Stress-Inducing Implant and Resulting Pattern Distortion in Amorphous Carbon Patterning", as filed on Apr. 28, 2003, including claims, drawings, and abstract (28 pages).

U.S. Appl. No. 10/445,129, entitled "Modified Film Stack and Patterning Strategy for Stress Compensation and Prevention of Pattern Distortion in Amorphous Carbon Gate Patterning", as filed on May 20, 2003, including claims, drawings, and abstract (29 pages).

* cited by examiner

USE OF MULTILAYER AMORPHOUS CARBON ARC STACK TO ELIMINATE LINE WARPAGE PHENOMENON

CROSS-REFERENCE TO RELATED PATENT APPLICATIONS

This application is related to U.S. patent application Ser. No. 10/215,173 entitled "Use of Amorphous Carbon Hard Mask for Gate Patterning to Eliminate Requirement of Poly Re-Oxidation," U.S. patent application Ser. No. 10/277,760 entitled "Sacrificial Air Gap Layer for Insulation of Metals," U.S. patent application Ser. No. 10/217,730 entitled "Ion Implantation to Modulate Amorphous Carbon Stress," U.S. patent application Ser. No. 10/424,420 entitled "Use of Amorphous Carbon for Gate Patterning," U.S. patent application Ser. No. 10/230,794 entitled "Formation of Amorphous Carbon ARC Stack Having Graded Transition Between Amorphous Carbon and ARC Material," U.S. patent application Ser. No. 10/335,726 entitled "Use of Diamond as a Hard Mask Material," U.S. patent application Ser. No. 10/424,675 entitled "Selective Stress-Inducing Implant and Resulting Pattern Distortion in Amorphous Carbon Patterning," U.S. patent application Ser. No. 10/230,775 entitled "Use of Buffer Dielectric Layer with Amorphous Carbon Mask to Reduce Line Warpage," and U.S. patent application Ser. No. 10/445,129 entitled "Modified Film Stack and Patterning Strategy for Stress Compensation and Prevention of Pattern Distortion in Amorphous Carbon Gate Patterning," each of which is assigned to the assignee of the present application.

FIELD OF THE INVENTION

The present invention relates generally to the field of integrated circuits and methods of manufacturing integrated circuits. More particularly, the present invention relates to the use of masks formed of amorphous carbon to form features in integrated circuits.

BACKGROUND OF THE INVENTION

Deep-submicron complementary metal oxide semiconductor (CMOS) is conventionally the primary technology for ultra-large scale integrated (ULSI) circuits. Over the last two decades, reduction in the size of CMOS transistors has been a principal focus of the microelectronics industry.

Transistors (e.g., MOSFETs), are often built on the top surface of a bulk substrate. The substrate is doped to form source and drain regions, and a conductive layer is provided between the source and drain regions. The conductive layer operates as a gate for the transistor; the gate controls current in a channel between the source and the drain regions.

Ultra-large-scale integrated (ULSI) circuits generally include a multitude of transistors, such as, more than one million transistors and even several million transistors that cooperate to perform various functions for an electronic component. The transistors are generally complementary metal oxide semiconductor field effect transistors (CMOSFETs) which include a gate conductor disposed between a source region and a drain region. The gate conductor is provided over a thin gate oxide material. Generally, the gate conductor can be a metal, a polysilicon, or polysilicon/germanium ($Si_xGe_{(1-x)}$) material that controls charge carriers in a channel region between the drain and the source to turn the transistor on and off. Conventional processes typically utilize polysilicon based gate conductors because metal gate conductors are difficult to etch, are less compatible with front-end processing, and have relatively low melting points. The transistors can be N-channel MOSFETs or P-channel MOSFETs.

Generally, it is desirable to manufacture smaller transistors to increase the component density on an integrated circuit. It is also desirable to reduce the size of integrated circuit structures, such as vias, conductive lines, capacitors, resistors, isolation structures, contacts, interconnects, etc. For example, manufacturing a transistor having a reduced gate length (a reduced width of the gate conductor) can have significant benefits. Gate conductors with reduced widths can be formed more closely together, thereby increasing the transistor density on the IC. Further, gate conductors with reduced widths allow smaller transistors to be designed, thereby increasing speed and reducing power requirements for the transistors.

As critical dimensions (CDs) of device structures are made smaller, certain issues must be addressed during processing. One such issue involves the use of a wet etch to remove mask layers used in the formation of the structures. When structures having small critical dimensions are produced, the introduction of phosphoric acid or other aqueous etchants to remove a mask layer may damage the structure formed during the etching process.

Another issue that must be addressed is that the shape integrity of the structures formed may be lessened where the materials used to form the mask layer include an internal stress. For example, where a mask material includes an internal compressive stress by virtue of the microstructure of the material, under certain conditions the mask material may deform. The deformed mask layer will then transfer the deformed pattern into the underlying material when the mask is used during an etch or material removal step. This phenomenon is sometimes referred to as line warpage or "wiggle." For example, conductive lines formed that exhibit warpage or wiggle characteristics may appear as a serpentine or curving structure. The warpage or wiggle of the line may increase the distance that electrons must travel through the conductive line (and hence increase the resistance of the conductive line) when compared to conductive lines that do not exhibit warpage or wiggle characteristics. Further, the warpage can affect the operation of the device due to the varying width of the gate conductor. Even further, this may cause a loss of pattern fidelity which may affect connectivity to other regions of the overall circuit (e.g., contacts), which may affect circuit operation.

Thus, there is a need to form structures in an integrated circuit using an improved method that produces structures having reduced critical dimensions. Further, there is a need to improve the shape integrity of structures formed during manufacturing (e.g., reducing or eliminating conductive line warpage, etc.). Even further, there is a need to use amorphous carbon as a mask in the formation of integrated circuit structures.

SUMMARY OF THE INVENTION

An exemplary embodiment relates to a method for producing an integrated circuit. The method includes providing a layer of polysilicon material above a semiconductor substrate and providing an amorphous carbon stack comprising at least one undoped amorphous carbon layer and at least one doped amorphous carbon layer over the polysilicon material layer. The method further includes removing a portion of the amorphous carbon stack to form a hard mask and etching the polysilicon material layer according to the hard mask to form a line of polysilicon material.

Another exemplary embodiment relates to a method for forming features in an integrated circuit. The method includes providing an amorphous carbon material above a layer of polysilicon. The amorphous carbon material comprises at least one region of nitrogen-doped amorphous carbon and at least one region of undoped amorphous carbon. The method also includes patterning the amorphous carbon material to form a mask and etching the layer of polysilicon according to the mask.

A further embodiment relates to an integrated circuit produced by a method that includes providing a layer of amorphous carbon above a layer of polysilicon, where a portion of the layer of amorphous carbon is doped with nitrogen. The method also includes providing an anti-reflective (ARC) layer above the layer of amorphous carbon and providing a mask over the ARC layer and the layer of amorphous carbon. The method further includes etching the ARC layer and the layer of amorphous carbon to form a pattern and etching the layer of polysilicon according to the pattern.

Other principal features and advantages will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF THE PREFERRED EMBODIMENTS

Figure 1:
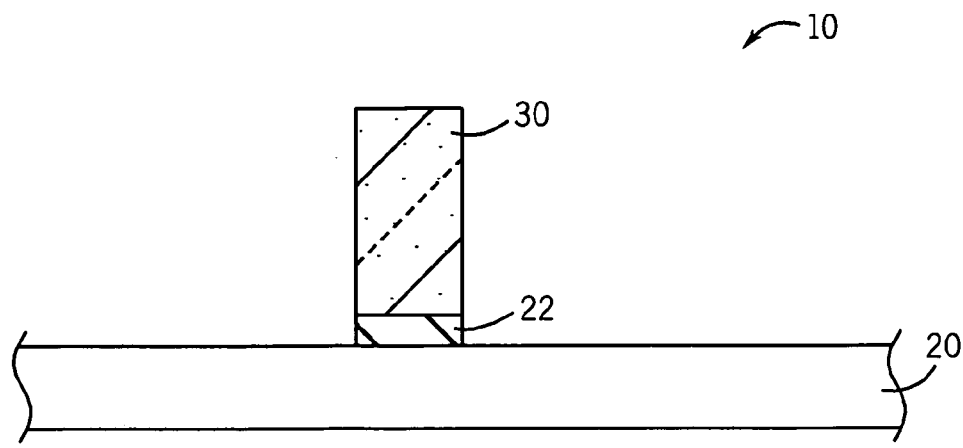
FIG. 1 is a schematic cross-sectional view of a portion of an integrated circuit fabricated in accordance with an exemplary embodiment.

Referring to FIG. 1, a portion 10 of an integrated circuit (IC) includes a substrate layer 20, an oxide or dielectric layer 22, and a line or gate conductor 30. Portion 10 is preferably part of an ultra-large-scale integrated (ULSI) circuit having a million or more transistors, and is manufactured as part of the IC on a wafer made of a semiconducting material (e.g., silicon, gallium arsenide, etc.).

Conductive line 30 can be a metal, a polysilicon, or polysilicon/germanium ($Si_xGe_{(1-x)}$) material that controls charge carriers in a channel region formed between source and drain regions in substrate 20 to turn the transistor on and off. Conductive line 30 may be doped or undoped. In an exemplary embodiment, conductive line 30 is made of a polysilicon material and has a thickness between approximately 1000 and 2000 angstroms and a width of between approximately 30 and 50 nanometers.

Figure 2A:
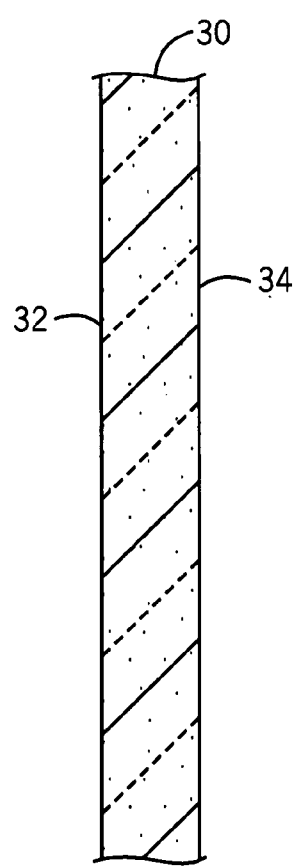
FIG. 2A is a top elevation view of the integrated circuit portion shown in FIG. 1 showing a feature formed without warpage.

As shown in the exemplary embodiment of FIG. 2A, conductive line 30 is preferably formed using a method that maintains the shape integrity of structures formed by reducing or eliminating the phenomenon of warpage or "wiggle." In an example of a conductive line formed in an integrated circuit, one result is that the tendency to form conductive lines having a generally serpentine or curved shape along their length is reduced or eliminated.

Figure 2B:
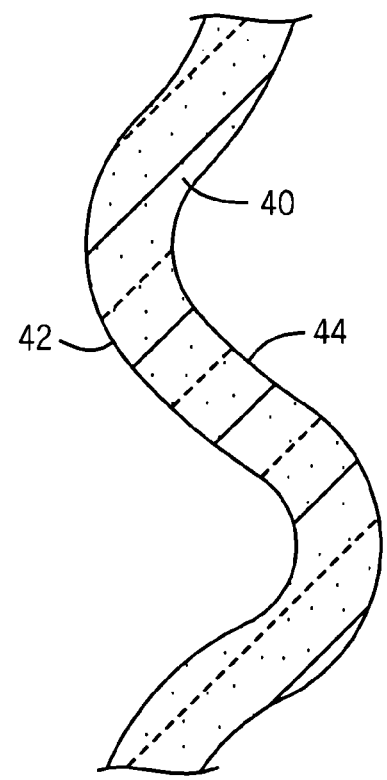
FIG. 2B is a top elevation view of a feature similar to that shown in FIG. 2A showing a warpage phenomenon.

The warpage phenomenon may be illustrated with reference to FIGS. 2A and 2B. In manufacturing integrated circuits, it is desirable to produce conductive lines that have a generally straight profile. One example of such a conductive line is shown in FIG. 2A, where the sides or lateral edges 32, 34 of conductive line 30 have a substantially straight or linear configuration along their length. In contrast to conductive line 30, FIG. 2B shows a conductive line 40 manufactured by a method that does not reduce or eliminate warpage along the length of conductive line 40. As shown, sides or edges 42, 44 are not linear, but rather include a generally curved or warped shape. The amount or magnitude of curvature may vary depending on various conditions, including the properties of the mask or patterning material used, the properties of the material being patterned or etched, and the processing conditions used during the etching operation, among others. Preferably, conductive line 30 deviates in width less than 5 percent of its largest width.

One material that may be used as a hard mask in the formation of integrated circuit structures having reduced critical dimensions (e.g., approximately 30–50 nanometers or less) is amorphous carbon. It has been discovered that when a layer of amorphous carbon material is patterned to provide a hard mask for features having reduced critical dimensions, shape integrity may be impaired due to the internal properties of the amorphous carbon material. One theory currently being investigated is that internal stresses (e.g., compressive or tensile stresses) in the amorphous carbon material cause the mask to deform. For example, where a layer of amorphous carbon is patterned to form a mask for a conductive line to be formed in a material underlying the mask, a cap layer or anti-reflective coating (ARC) layer may be provided above the amorphous carbon pattern. When this cap or ARC layer is removed, stresses in the amorphous carbon material may cause the mask to buckle or deform to produce a wavy or serpentine pattern. This serpentine pattern is transferred to the conductive line material in a subsequent etching step.

A method for producing portion 10 that reduces or eliminates warpage in the formation of conductive line 30 is described below with reference to FIGS. 3 to 9. FIG. 10 is a flow diagram that outlines the process 200 used in the formation of portion 10.

Figure 3:
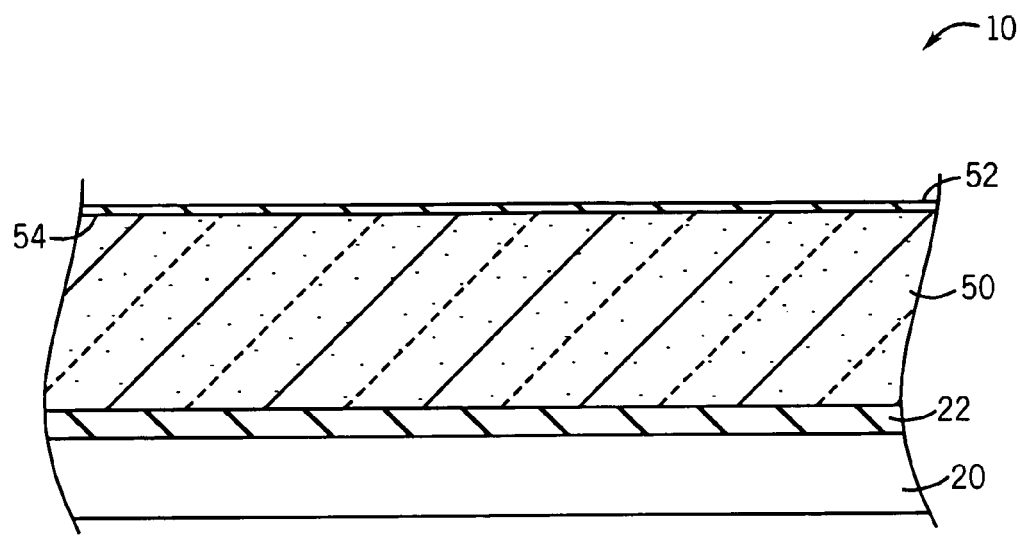
FIG. 3 is a schematic cross-sectional view of the portion shown in FIG. 1 illustrating a polysilicon deposition step.

In a step 210 (FIG. 10) illustrated in FIG. 3, a layer 50 of conductive or semiconductive material is provided above or over a layer 22 of dielectric material, which is in turn provided above a silicon wafer 20. Layer 50 may be any of a variety of materials suitable for use in a conductive line or gate structure (e.g., metal, polysilicon, polysilicon/germanium ($Si_xGe_{(1-x)}$), etc.) and may be doped or undoped. Layer 22 may be any of a variety of materials suitable for use as a gate dielectric material (e.g., silicon dioxide, silicon nitride, high-k gate dielectrics, etc.). In an exemplary embodiment, layer 50 is polysilicon and layer 22 is silicon dioxide thermally grown on silicon substrate 20. In an alternative embodiment, layer 50 may include multiple layers of material, one or more of which may include polysilicon.

In an exemplary embodiment, layer 50 has a thickness of between approximately 1,000 and 2,000 angstroms and layer 22 has a thickness of between approximately 10 and 20 angstroms. In an alternative embodiment, layer 50 has a thickness of between approximately 1,000 and 2,500 angstroms and layer 22 has a thickness of between approximately 10 and 50 angstroms. Alternatively, layer 22 can be other types of materials used in the formation of narrow lines or structures.

When polysilicon layer 50 is formed, a thin layer 52 of oxide forms on the top or upper surface 54 of polysilicon layer 50. Oxide layer 52 may be referred to as a "native" oxide layer. The thickness of oxide layer 52 may vary depending on various processing conditions. In an exemplary embodiment, the thickness of oxide layer 52 is between approximately 10 and 30 angstroms.

Figure 6:
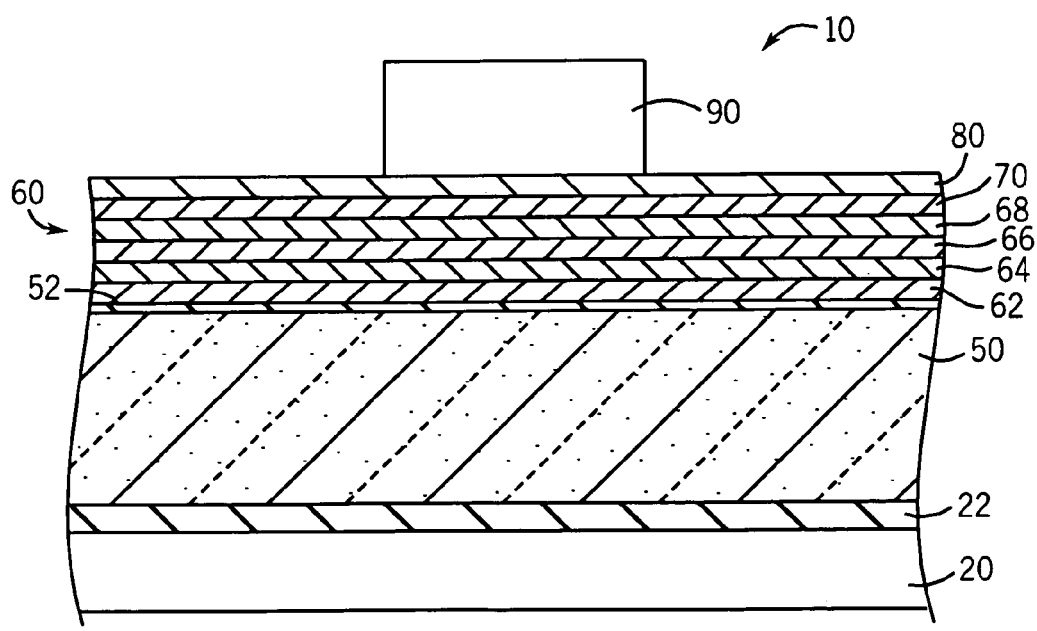
FIG. 6 is a schematic cross-sectional view of the portion shown in FIG. 1 illustrating an anti-reflective coating (ARC) layer deposition and mask formation step.

As best shown in FIG. 6, in a step 220 a layer or film 60 of amorphous carbon material is deposited above or over polysilicon layer 50. In a preferred embodiment, amorphous carbon layer 60 is a stack of regions or layers and has a total thickness of between approximately 500 and 700 angstroms. In alternative embodiments, the thickness of amorphous carbon layer 60 may vary depending on various design considerations. For example, the amorphous carbon layer may have a thickness of less than 500 angstroms (e.g., between 300 and 500 angstroms or less). In another alternative embodiment, the amorphous carbon layer may have a thickness of greater than 700 angstroms (e.g., between 700 and 900 angstroms or greater).

One advantageous feature of providing an amorphous carbon layer that may be produced with various thicknesses is that the amorphous carbon layer may be produced in a thickness suitable for patterning polysilicon layer 50. For example, where a particular thickness of polysilicon is provided, the thickness of the amorphous carbon layer may be altered so that the proper amount of mask material is provided over the polysilicon material to compensate for the etch selectivities of the materials used. This allows for increased manufacturing efficiency by eliminating unnecessary material use.

Although the method for doping layer 64 preferably involves depositing the amorphous carbon and the dopant from the gas phase (e.g., using a PECVD process with a process gas containing nitrogen), other methods of doping layer 64 may also be used. For example, in an alternative embodiment, a layer of pure amorphous carbon may be deposited and implanted with nitrogen using conventional ion implantation methods. Additionally, although nitrogen is preferably used as the dopant, other dopant species may be used (e.g., He, Xe, Ar, Rn, Kr, Ne, etc.). These alternative species may be deposited from the gas phase where possible or may be implanted using other conventional methods. For example, a pure amorphous carbon layer may be deposited and implanted with xenon ions.

In a preferred embodiment, amorphous carbon layer 60 (FIG. 6) includes a plurality of material layers, and the thickness of amorphous carbon layer 60 depends on the number and thickness of layers provided. In the exemplary embodiment shown in FIG. 6, amorphous carbon layer 60 includes five layers (i.e., layers 62, 64, 66, 68, and 70). In alternative embodiments, a different number of layers may be used to form amorphous carbon layer 60.

In an exemplary embodiment, each of layers 62, 64, 66, 68, and 70 may have a thickness of between approximately 50 and 150 angstroms. The thicknesses of the individual layers may be identical or may differ. For example, a first layer may have a thickness of approximately 100 angstroms, while a second layer may have a thickness of approximately 150 angstroms. The various thickness of the layers used to form amorphous carbon layer 60 may each be varied depending on the desired properties for amorphous carbon layer 60.

Each of layers 62, 64, 66, 68, and 70 may be doped or undoped amorphous carbon. The dopant or implant used to form the doped layers may be nitrogen (N) or another species (e.g., helium (He), argon (Ar), krypton (Kr), radon (Ra), xenon (Xe), neon (Ne), etc.) that may alter the internal stresses of the base amorphous carbon material. For example, if undoped amorphous carbon material exhibits a generally tensile internal stress profile, the introduction of nitrogen or another species may alter or adjust the stress to reduce the magnitude of the stress or to change the stress to a compressive stress.

By forming amorphous carbon layer 60 from a variety of doped and undoped amorphous carbon layers, the overall internal stress characteristics of amorphous carbon layer 60 may be modified. In a preferred embodiment, layers 62, 66, and 70 are undoped amorphous carbon layers, while layers 64 and 68 are nitrogen-doped amorphous carbon layers. In an alternative embodiment, layers 62, 66, and 70 may be undoped amorphous carbon while layers 64 and 68 are nitrogen-doped amorphous carbon. Thus, in these two embodiments, amorphous carbon layer 60 is formed from alternating layers of undoped and nitrogen-doped amorphous carbon. Other configurations of amorphous carbon layer 60 are also possible. For example, two or more immediately adjacent layers included in the amorphous carbon layer may be doped amorphous carbon. For example, a layer of nitrogen-doped amorphous carbon may abut a layer of xenon-doped amorphous carbon. In this manner, the amorphous carbon layer may be modified by providing various doped and undoped amorphous carbon layers to effect a particular internal stress characteristic.

To facilitate the description below, amorphous carbon layer 60 will be described with reference to the preferred embodiment described above, in which alternating undoped and doped materials form amorphous carbon layer 60. Layers 62, 66, and 70 are referred to as first, second, and third undoped amorphous carbon layers and layers 64 and 68 are referred to as first and second doped amorphous carbon layers. It should be understood to one of skill in the art that the various layers may be doped or undoped depending on the desired amorphous carbon layer properties, as described above with regard to the various alternative embodiments.

Figure 4:
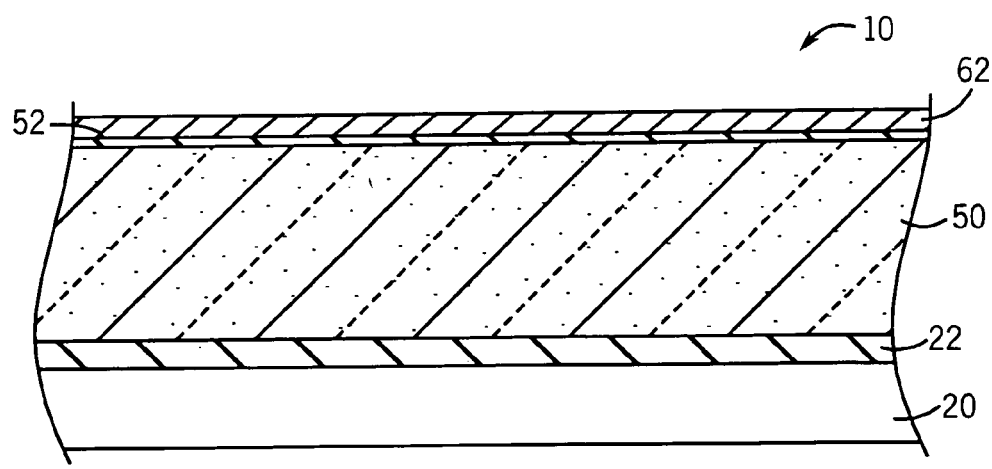
FIG. 4 is a schematic cross-sectional view of the portion shown in FIG. 1 illustrating an amorphous carbon layer deposition step.

FIG. 4 shows the deposition of first undoped amorphous carbon layer 62. Layer 62 is deposited in a plasma-enhanced chemical vapor deposition (PECVD) process using an atmosphere of hydrocarbon precursor, such as ethylene, propylene, methane, and the like. The PECVD process is performed at a temperature of between approximately 400° and 550° C. and a pressure of between approximately 5 and 10 torr with a plasma power of between approximately 800 and 1,500 watts. In an exemplary embodiment, layer 62 has a thickness of between approximately 100 and 150 angstroms.

Figure 5:
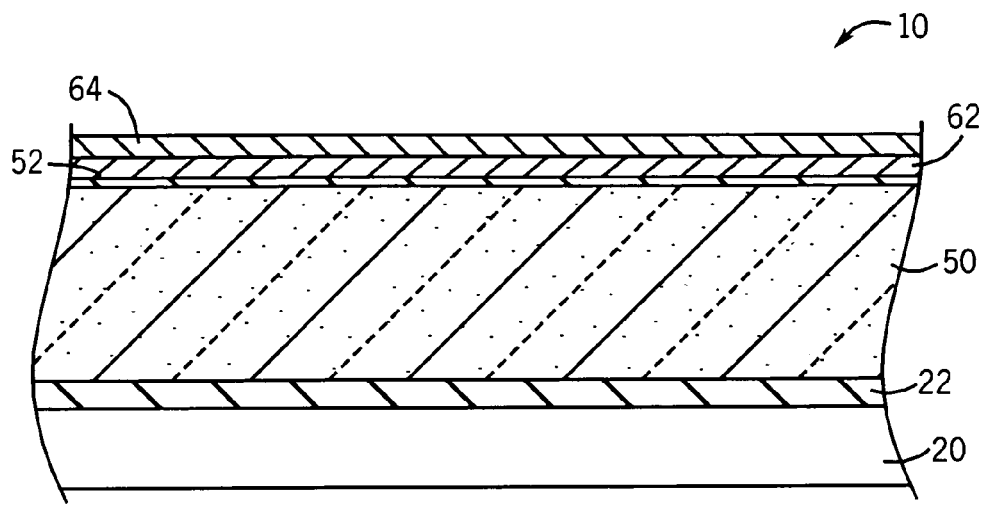
FIG. 5 is a schematic cross-sectional view of the portion shown in FIG. 1 illustrating an inert ion implantation step.

FIG. 5 shows the deposition of first doped amorphous carbon layer 64. In an exemplary embodiment, each of the doped and undoped amorphous carbon layers are deposited at approximately the same temperature and in the same plasma deposition chamber. Layer 64 is deposited in a plasma-enhanced chemical vapor deposition (PECVD) process using a hydrocarbon precursor such as ethylene, propylene, methane, and the like. The PECVD process is performed at a temperature of between approximately 4000 and 550° C. and a pressure of between approximately 5 and 10 torr with a plasma power of between approximately 800 and 1,500 watts. To achieve a doping concentration of approximately 6 atomic percent nitrogen, a flow ratio approximately 1:10 is used for the hydrocarbon precursor to nitrogen gas flow rate (e.g., 300 cubic centimeters of precursor per minute to 3 liters of nitrogen per minute). In alternative embodiments, doping concentrations of between 3 and 9 atomic percent may be achieved by varying the various processing conditions (e.g., increasing or decreasing the gas flow ratio of hydrocarbon to nitrogen, etc.). In an exemplary embodiment, layer 64 has a thickness of between approximately 100 and 150 angstroms.

In the exemplary embodiment shown with reference to FIGS. 3–8, the process described above for layer 62 is repeated to form layers 66 and 70 and the process described above for layer 64 is repeated to form layer 68. The result is shown in FIG. 6, in which amorphous carbon layer 60 comprises three undoped layers and two doped layers. As described above, in alternative embodiments, a different number or composition of layers may be used to form amorphous carbon layer 60.

In a step 230, shown in FIG. 6, a cap layer 80 is deposited above or over amorphous carbon layer 60. Cap layer 80 may be formed of an anti-reflective material to form an anti-reflective coating (ARC) layer. ARC layer 80 may include silicon nitride (SiN), silicon oxynitride (SiON), silicon-rich oxide (e.g., non-stoichiometric oxide-containing silicon material), silicon-rich nitride, and the like. In an exemplary embodiment, ARC layer 80 has a thickness of between approximately 200 and 250 angstroms. One advantageous feature of using a cap layer formed from an anti-reflective material is that the amorphous carbon layer will be protected during deposition and exposure of a photoresist material above amorphous carbon layer 60 and that reflection of ultraviolet (UV) rays used in the exposure of the photoresist will be reduced. Another advantageous feature is that the photolithography process may be reworked, because the plasma oxygen strip conventionally used to remove photoresist material is prevented from attacking the amorphous carbon.

In a step 240, a layer of photoresist material is deposited above or over cap layer 80 (e.g., by spin-coating) and exposed to form a photoresist feature 90. The layer of photoresist is deposited by spin coating at a thickness of between approximately 1000 and 4000 angstroms and is patterned to have a width of between approximately 80 and 200 nanometers. Any of a variety of photoresist materials may be used, including photoresist materials that may be etched using UV rays having wavelengths of 193 or 248 nanometers.

Figure 7:
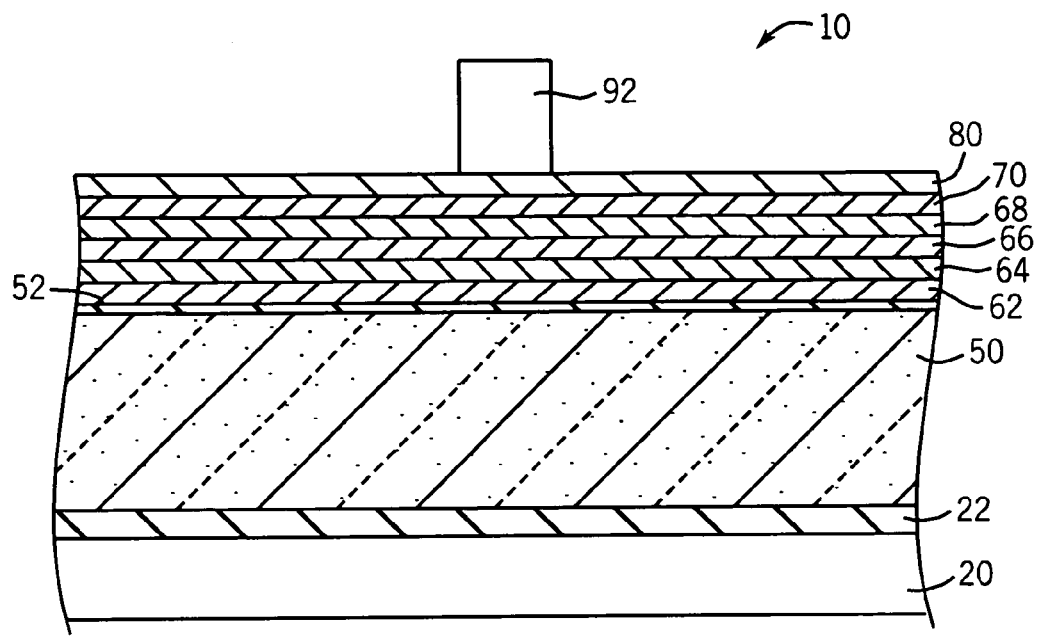
FIG. 7 is a schematic cross-sectional view of the portion shown in FIG. 1 illustrating a mask trimming step.

In a step 250 shown in FIG. 7, photoresist feature 90 is trimmed to form a photoresist mask 92 having reduced critical dimensions. Trimming is accomplished by oxidizing the photoresist feature and removing the oxidized portion, which results in a photoresist mask having reduced dimensions. The thickness of the photoresist mask formed may depend on the trim rate. For example, in an exemplary embodiment, a trim etching step may erode or remove between approximately 3 to 4 nanometers per second in the vertical direction and between approximately 1.5 and 2.5 nanometers per second in the lateral direction. Other trim rates may be used, and may depend on the type of photoresist material used. Process 200 is particularly advantageous when narrow gate conductors are formed when using trim etching techniques.

In an exemplary embodiment, photoresist mask 92 has a thickness of between approximately 300 and 400 angstroms and a width of between approximately 30 and 50 nanometers after trim etching. In alternative embodiments, photoresist mask may have a thickness of between approximately 200 and 600 angstroms and a width of approximately 20 and 50 angstroms.

Figure 8:
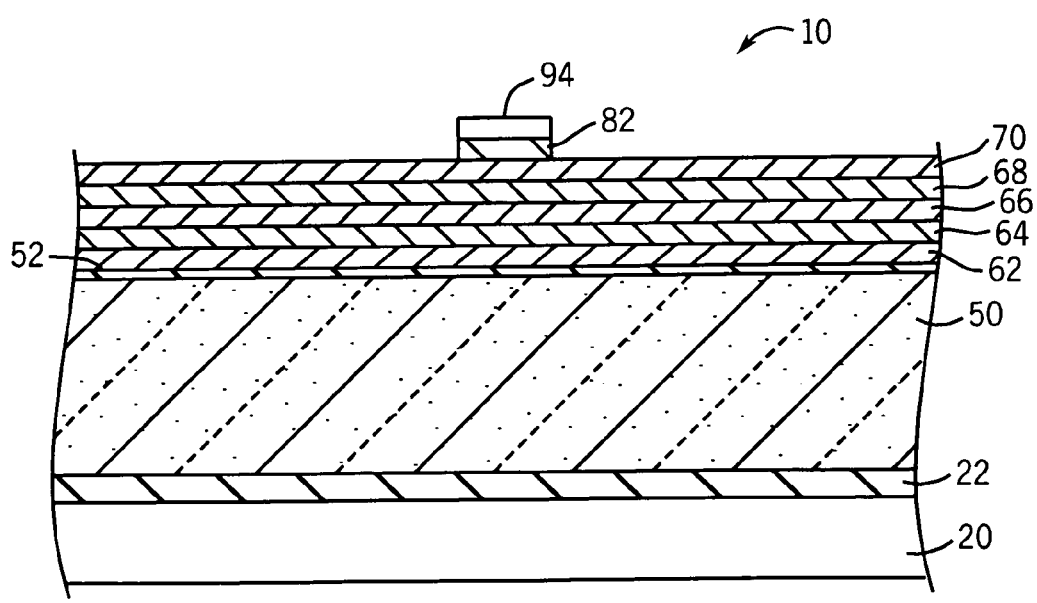
FIG. 8 is a schematic cross-sectional view of a portion shown in FIG. 1 illustrating the formation of a mask for patterning an amorphous carbon layer.

In a step 260 shown in FIG. 8, photo resist mask 92 is used as a mask to pattern cap layer 80 to form a cap feature 82. A small amount of photoresist material 94 remains through the etching and overetching of cap layer 80. In an exemplary embodiment, cap layer 80 is etched using a fluorine-based plasma (e.g., $CF_4$, $CF_4/CHF_3$, $CF_4/CH_2F_2$, etc.). The etching is performed in an argon or helium atmosphere at a temperature of between approximately 20° and 50° C. and a pressure of between approximately 3 and 50 millitorr.

Figure 9:
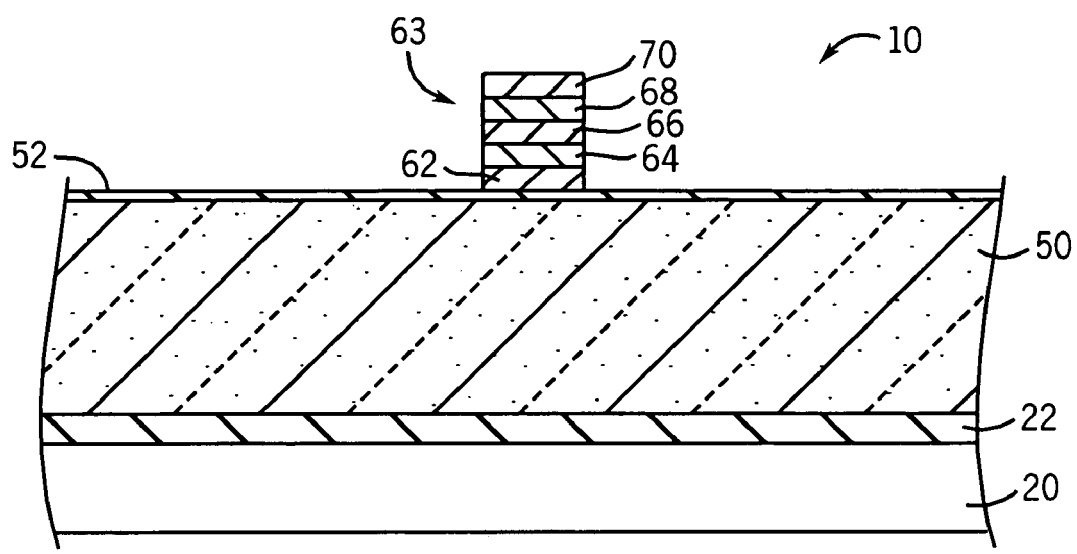
FIG. 9 is a schematic cross-sectional view of a portion shown in FIG. 1 illustrating the formation of an amorphous carbon mask feature.
Figure 10:
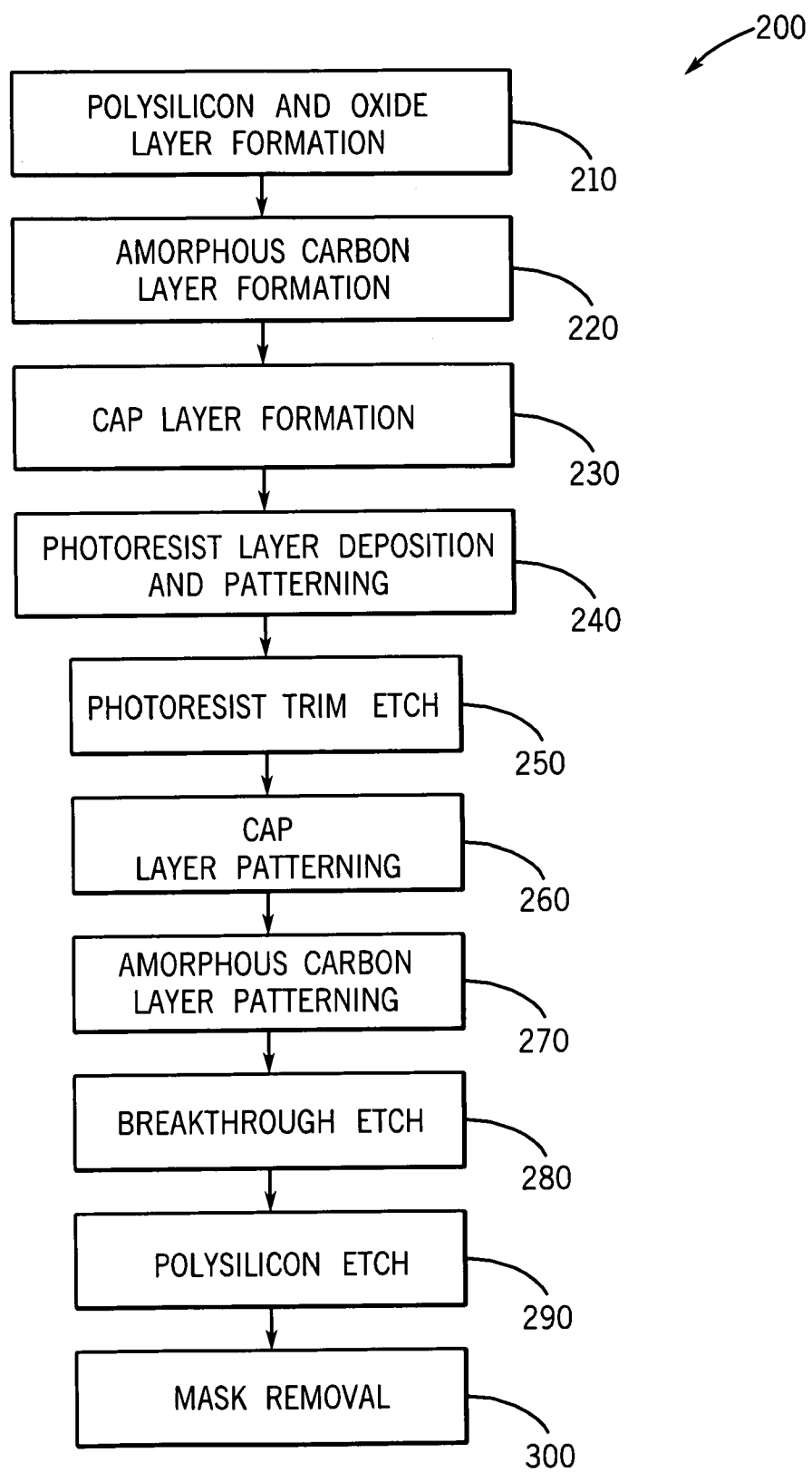
FIG. 10 is a flow diagram illustrating the process of forming structures in an integrated circuit.

In a step 270 shown in FIG. 9, cap feature 82 is used as a mask to pattern amorphous carbon layer 60 to form amorphous carbon mask 63. In an exemplary embodiment, amorphous carbon layer 60 is etched using an oxygen-based plasma at a temperature of between approximately 40° and 60° C. and a pressure of between approximately 3 and 10 millitorr. For example, the plasma used may be an oxygen-hydrogen-bromide plasma, an oxygen-nitrogen plasma, an oxygen-$CHF_3$ plasma, and the like. Argon may also be present in the atmosphere. The plasma power may be adjusted so that the ion density power is between approximately 800 and 1,200 watts and the ion energy control is between approximately 50 and 200 watts. During etching of amorphous carbon layer 60, any remaining photoresist (e.g., 94 shown in FIG. 8) is removed.

In an exemplary embodiment, amorphous carbon mask 63 has a width of between approximately 30 and 60 nanometers. Using the plasma etch method described above, amorphous carbon mask 63 is formed without the introduction of aqueous etchants, which may damage or destroy mask 63 as processing proceeds. For example, the use of phosphoric acid as an etchant is eliminated by using a mask layer of amorphous carbon, since portions of the amorphous carbon layer may be removed using a plasma etch.

In a step 280, a breakthrough or native oxide removal etch is performed to remove oxide layer 52 from the surface of polysilicon layer 50 prior to patterning polysilicon layer 50. The breakthrough etch step is performed using a $CF_4/Ar$ or $CF_4/He$ plasma at a pressure of between approximately 3 and 25 millitorr, a plasma ion source power of between approximately 300 and 1000 watts, and a temperature of between approximately 30° and 50° C. A plasma ion energy control power of between approximately 100 and 300 watts can be used. During the breakthrough step, cap layer 80 begins to erode. Subsequent etching of polysilicon layer 50 (described below) results in complete removal of the cap layer.

In a step 290, amorphous carbon mask 63 is used to pattern or form features in polysilicon layer 50. For example, polysilicon layer 50 may be etched to form conductive line 30 (shown in FIG. 1). The polysilicon etch is performed using commonly used chemistries such as HBr/Cl$_2$/O$_2$, HBr/Cl$_2$/N$_2$, HBr/Cl$_2$/O$_2$/CF$_4$, etc. at a temperature of between approximately 40° and 60° C. and a pressure of between approximately 3 and 50 millitorr. In subsequent steps (not shown), additional material layers and features may be formed on or in portion 10.

In a step 300, amorphous carbon mask 63 is removed after polysilicon layer 50 is patterned (e.g., to form conductive line 30 formed in FIG. 1). The amorphous carbon mask may be removed using a method similar to that described above, in which an oxygen-containing plasma may be used to remove or "ash" away the amorphous carbon mask to expose the top surface of conductive line 30. In subsequent processing steps, other material layers and devices may be added to above portion 10 to form a complete integrated circuit.

While the exemplary embodiments illustrated in the FIGURES and described above are presently preferred, it should be understood that these embodiments are offered by way of example only. Other embodiments may include, for example, different methods of depositing the various layers above the substrate, different combination of times, temperatures, pressures, and the like. The invention is not limited to a particular embodiment, but extends to various modifications, combinations, and permutations that nevertheless fall within the spirit and scope of the appended claims.

What is claimed is:

1. A method for producing an integrated circuit comprising:
   providing a layer of polysilicon material above a semiconductor substrate;
   providing an amorphous carbon stack comprising a plurality of undoped amorphous carbon layers and a plurality of doped amorphous carbon layers;
   removing a portion of the amorphous carbon stack to form a hard mask; and
   etching the polysilicon material layer according to the hard mask to form a line of polysilicon material.

2. The method of claim 1, further comprising providing an anti-reflective coating (ARC) layer above the amorphous carbon stack; wherein the step of removing a portion of the amorphous carbon stack comprises removing a portion of the ARC layer.

3. The method of claim 2, wherein the ARC layer comprises at least one of silicon nitride, silicon oxynitride, silicon-rich oxide, and silicon-rich nitride.

4. The method of claim 2, wherein the step of removing a portion of the amorphous carbon stack comprises providing a photoresist mask above, the ARC layer to pattern the ARC layer and etching the amorphous carbon stack according to the patterned ARC layer.

5. The method of claim 1, wherein the step of removing a portion of the amorphous carbon stack comprises etching with an oxygen-containing plasma.

6. The method of claim 1, wherein the amorphous carbon stack has a thickness of between approximately 500 and 700 nanometers.

7. A method for producing an integrated circuit comprising:
   providing a layer of polysilicon material above a semiconductor substrate;
   providing an amorphous carbon stack comprising at least one undoped amorphous carbon layer and at least one doped amorphous carbon layer over the polysilicon material layer;
   removing a portion of the amorphous carbon stack to form a hard mask; and
   etching the polysilicon material layer according to the hard mask to form a line of polysilicon material;
   wherein the amorphous carbon stack comprises alternating layers of doped and undoped amorphous carbon, each of the layers of doped and undoped amorphous carbon having a thickness of between approximately 100 and 150 nanometers.

8. The method of claim 1, wherein the at least one doped amorphous carbon layer comprises between approximately 3 and 9 atomic percent nitrogen.

9. The method of claim 1, wherein the hard mask has a width of between approximately 30 and 60 nanometers.

10. The method of claim 1, wherein at least one of the plurality of doped amorphous carbon layers comprises nitrogen.

11. The method of claim 1, wherein at least one of the plurality of doped amorphous carbon layers comprises a material selected form the group consisting of helium, xenon, argon, radon, krypton, and neon.

12. The method of claim 11, wherein at least one of the plurality of doped amorphous carbon layers comprises nitrogen.

13. A method for forming features in an integrated circuit comprising:
   providing an amorphous carbon material above a layer of polysilicon, the amorphous carbon material comprising a plurality of nitrogen-doped amorphous carbon regions, a plurality of undoped amorphous carbon regions, and at least one amorphous carbon region doped with a material selected from the group consisting of helium, xenon, argon, radon, krypton, and neon;
   patterning the amorphous carbon material to form a mask; and
   etching the layer of polysilicon according to the mask.

14. The method of claim 13, wherein the amorphous carbon material has a thickness of between approximately 500 and 700 angstroms.

15. The method of claim 13, wherein each of the regions of nitrogen-doped and undoped amorphous carbon regions have a thickness of between approximately 100 and 150 angstroms.

16. The method of claim 13, wherein the step of patterning the amorphous carbon material comprises etching the amorphous carbon material using an oxygen-based plasma.

17. The method of claim 13, further comprising depositing an anti-reflective coating (ARC) layer above the amorphous carbon material and patterning the ARC layer, wherein the step of patterning the amorphous carbon material comprises etching the amorphous carbon material according the patterned ARC layer.

18. The method of claim 13, wherein a plurality of nitrogen-doped amorphous carbon regions are doped using an ion implantation technique.

19. A method of producing an integrated circuit comprising:
   providing a layer of amorphous carbon above a layer of polysilicon, a portion of the layer of amorphous carbon being doped with nitrogen by ion implantation and a portion of the layer of amorphous carbon being doped with at least one material selected from the group consisting of helium, xenon, argon, radon, krypton, and neon;
   providing an anti-reflective (ARC) layer above the layer of amorphous carbon;

providing a mask over the ARC layer and the layer of amorphous carbon;

etching the ARC layer and the layer of amorphous carbon to form a pattern; and etching the layer of polysilicon according to the pattern.

20. The method of claim 19, wherein the ARC layer comprises at least one of silicon oxynitride, silicon nitride, silicon-rich oxide, and silicon-rich nitride.

21. The method of claim 19, wherein the amorphous carbon layer includes at least one nitrogen-doped amorphous carbon layer and at least one undoped amorphous carbon layer.

22. The method of claim 21, wherein the amorphous carbon layer has a thickness of between approximately 500 and 700 angstroms and each of the at least one nitrogen-doped amorphous carbon layer and the at least one undoped amorphous carbon layer has a thickness of between approximately 100 and 150 angstroms.

23. The method of claim 19, wherein the step of etching the layer of polysilicon produces a polysilicon line having a width of between approximately 30 and 60 nanometers.

* * * * *